United States Patent [19]

Romero et al.

[11] Patent Number: 5,666,269
[45] Date of Patent: Sep. 9, 1997

[54] METAL MATRIX COMPOSITE POWER DISSIPATION APPARATUS

[75] Inventors: Guillermo L. Romero, Phoenix; Samuel J. Anderson; Brent W. Pinder, both of Tempe, all of Ariz.

[73] Assignee: Motorola, Inc., Schaumburg, Ill.

[21] Appl. No.: 741,576

[22] Filed: Oct. 28, 1996

Related U.S. Application Data

[63] Continuation of Ser. No. 513,315, Aug. 19, 1996, abandoned, which is a continuation of Ser. No. 176,598, Jan. 3, 1994, abandoned.

[51] Int. Cl.[6] .................................................. H05K 7/20
[52] U.S. Cl. ........................ 361/699; 165/80.4; 174/16.3; 257/714; 428/901
[58] Field of Search ........................ 62/259.2; 174/15.1, 174/16.1, 16.3, 52.4; 165/80.3, 80.4, 185, 104.33, 905; 428/620, 901, 539.5, 565, 551, 553, 554, 557, 559; 164/97–105, 122, 122.1; 257/703, 704, 707, 713, 714, 722; 361/689, 713, 699–710, 717–720, 722

[56] References Cited

U.S. PATENT DOCUMENTS

| | | |
|---|---|---|
| 4,341,432 | 7/1982 | Cutchaw . |
| 4,867,235 | 9/1989 | Grapes et al. . |
| 4,966,226 | 10/1990 | Hamburgen ............ 165/104.26 |
| 5,020,583 | 6/1991 | Aghajanian ................. 164/97 |
| 5,126,829 | 6/1992 | Daikoku ..................... 357/82 |
| 5,222,542 | 6/1993 | Burke .......................... 164/97 |
| 5,303,763 | 4/1994 | Aghajanian ................. 164/97 |
| 5,313,098 | 5/1994 | Tumpey ..................... 257/712 |
| 5,316,069 | 5/1994 | Aghajanian ................. 164/97 |
| 5,371,043 | 12/1994 | Anderson et al. . |

FOREIGN PATENT DOCUMENTS 0471552   2/1992   European Pat. Off. .

OTHER PUBLICATIONS

"Metal–Matrix Composites for Electronic Packaging" by Carl Zweben, JOM, vol. 44, Iss. 7, pp.15–23, Jul. 1992.
Japanese Patent Abstract for Hitachi, Ltd. having publication No. JP61029160, application No. JP840149502, and a publication date of Feb. 10, 1986. 1 page.

*Primary Examiner*—Gerald P. Tolin
*Attorney, Agent, or Firm*—Rennie William Dover; Aaron B. Bernstein

[57] ABSTRACT

A liquid cooled power dissipation apparatus (10) includes a metal matrix composite heat sink (11) with an insulation layer (17) integral to the apparatus (10). The insulation layer (17) is made integral to the apparatus (10) during infiltration of the metal matrix composite heat sink (11). Electronic components 23 are situated on top of the insulation layer (17).

11 Claims, 2 Drawing Sheets

METAL MATRIX COMPOSITE POWER DISSIPATION APPARATUS

This application is a continuation of prior application Ser. No. 08/513,315, filed Aug. 19, 1996, abandoned, which is a continuation of prior application Ser. No. 08/176,598, filed on Jan. 3, 1994, now abandoned.

BACKGROUND OF THE INVENTION

There exists an ever increasing demand for power dissipation schemes for electronic circuits. Circuits used in fields such as industrial motor control, power supplies for computers, electric vehicles, etc. tend to be very high power and require efficient heat dissipation means. In the past, one approach for dissipating a great deal of heat from electronic circuits has been to use a liquid cooling scheme whereby the electronic circuit is mounted to a heatsink apparatus which has liquid flowing through it.

In the past, it has been very expensive and difficult to fabricate an effective heatsink apparatus. For example, the prior liquid cooled heatsinks have been machined as two separate parts. The two parts are welded or brazed together to form a cavity through which liquid flows. The electronic circuit would typically be laid out on a substrate which would be soldered to the heatsink. Such a configuration gives rise to many disadvantages.

For example, with a typical metal liquid cooled structure comprised of two welded or brazed halves, with a meandering channel enclosed within, there is an inherent problem with corrosion of the welded or brazed joint. Attempts have been made to plate the inside of the channel or line it with metal foils that have good corrosion properties. Alternatively, copper tubing shaped and embedded in an aluminum plate has been used. The described prior fabrication methods require expensive machining, are labor intensive, and do not provide the optimal cooling environment for high power circuits.

Another disadvantage of prior schemes is their weight. For applications such as electric vehicles or electric trains, the power electronics comprise a substantial portion of the motor driver. Reduction and weight of these components translates to energy savings. Conventional liquid cooled power modules, since they are made of metal or metal alloys, are inherently very heavy.

Another important disadvantage of conventional liquid cooled modules is their reliability. Ceramic isolation substrates which support the circuit must be soldered onto the metal liquid cooled baseplates. The process has two disadvantages, thermal mismatch and voiding. The thermal mismatch is typically between 10–12 ppm/° C. This leads to high strains and stresses during any type of thermal cycling. Solder fatigue and crack propagation can lead to cracks running the entire lateral length of a solder joint.

Furthermore, soldering large areas is generally difficult and often leaves large voids randomly located under the substrate. The implication of both thermal mismatch and voiding is poor heat transfer and therefore poor performance and reliability.

Consequently, what is needed is a power dissipation apparatus which avoids the disadvantages of expensive fabrication, cumbersome weight, thermal mismatch, voiding and reduced performance and reliability.

DETAILED DESCRIPTION OF THE DRAWINGS

One representative embodiment of the present invention is a power dissipation apparatus which comprises a metal matrix composite (MMC) liquid cooled heatsink structure. The MMC liquid cooled heatsink structure has a ceramic isolation layer formed integrally to the top of the structure. The electronic circuit from which power must be dissipated is laid out on top of the isolation layer. Such a power dissipation apparatus provides substantial improvement over the prior art, including several advantages.

For example, MMC technology allows cost effective molded fabrication of a liquid cooled structure. In the preferred embodiment, molded silicon carbide ceramic preforms are infiltrated with an aluminum alloy to form the MMC liquid cooled baseplate. Since it is molded, any standard molded feature can be added to the structure (at a minimal cost) to increase functionality or simplify assembly. Additionally, during the infiltration process a silicon carbide preform base is united with a silicon carbide lid to form a one piece hermetically sealed structure. The molding and infiltration steps completely eliminate the need for expensive machining, brazing or welding, and common associated problems.

Still another important advantage of the molded MMC liquid cooled baseplate is the ability to integrally bond a ceramic substrate to the baseplate during the infiltration process. Thus no soldering is necessary, and the associated problems are eliminated. Finally, the MMC structure has a coefficient of thermal expansion which closely matches typical ceramic substrates. This results in lower thermal-mechanical stresses and improves the modules reliability.

Figure 1:
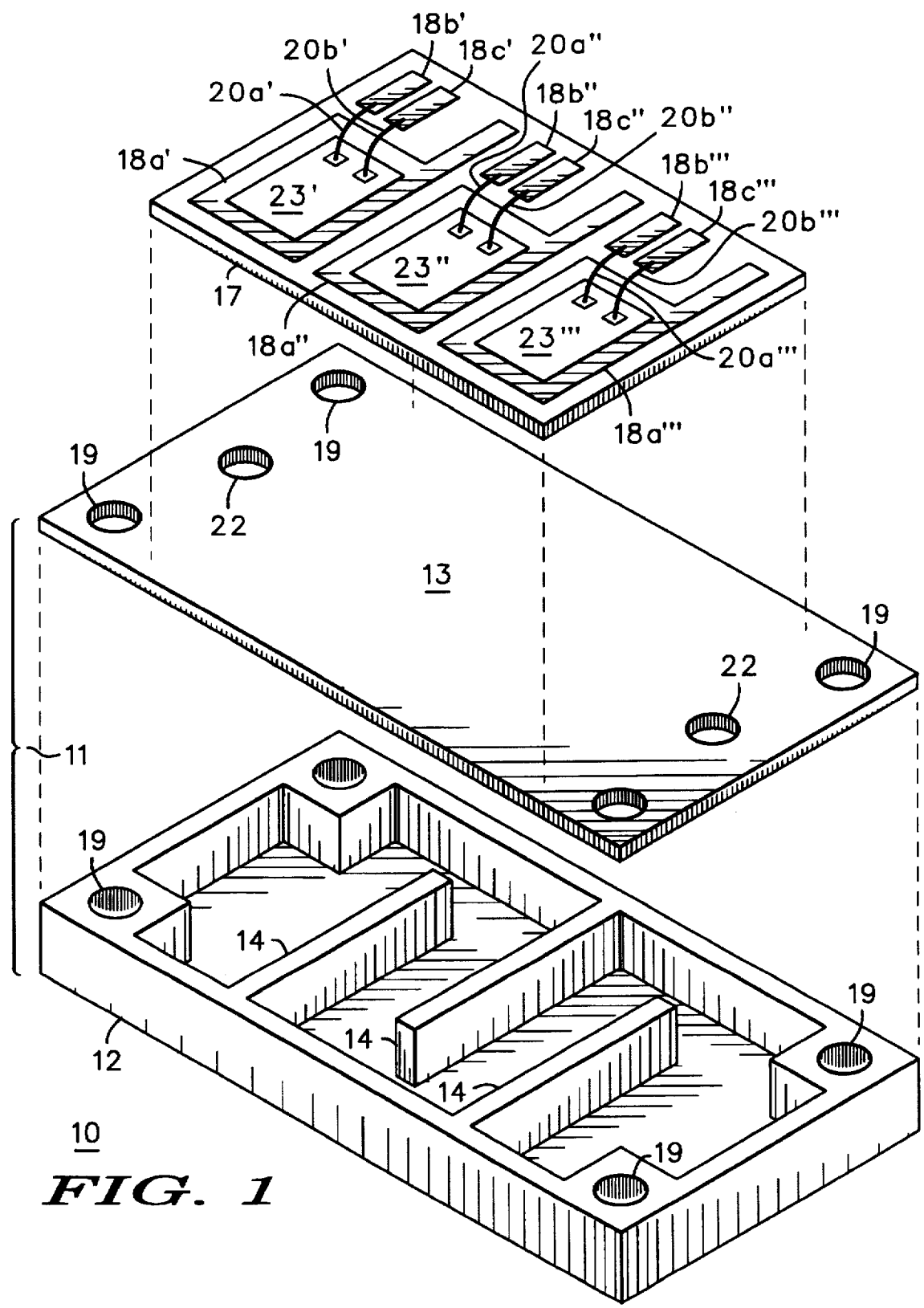
FIG. 1 is a simplified exploded perspective view of a power dissipation apparatus.

Turning to the Figures for a more specific understanding of one embodiment of the present invention, FIG. 1 is a simplified exploded perspective view of a power dissipation apparatus. FIG. 1 illustrates power dissipation apparatus 10. Power dissipation apparatus 10 comprises Metal matrix composite (MMC) liquid cooled heatsink structure 11. MMC liquid cooled heatsink structure 11 includes base 12 and lid 13. Base 12 and lid 13 are each formed according to well known methods for forming MMC components. For example, preforms for base 12 and lid 13 may be formed by combining silicon carbide powder with a binder. This is a process well understood by those with average knowledge of the industry. This slurry is then molded into the shapes required for base 12 and lid 13 using conventional injection molding technology. An oven is used to burn away the binders, leaving a porous structure ready for infiltration. At this point a molten aluminum alloy is infiltrated into the porous silicon carbide preform, reinforcing the part and combining base 12 and lid 13 into a unitary sealed structure.

Figure 3:
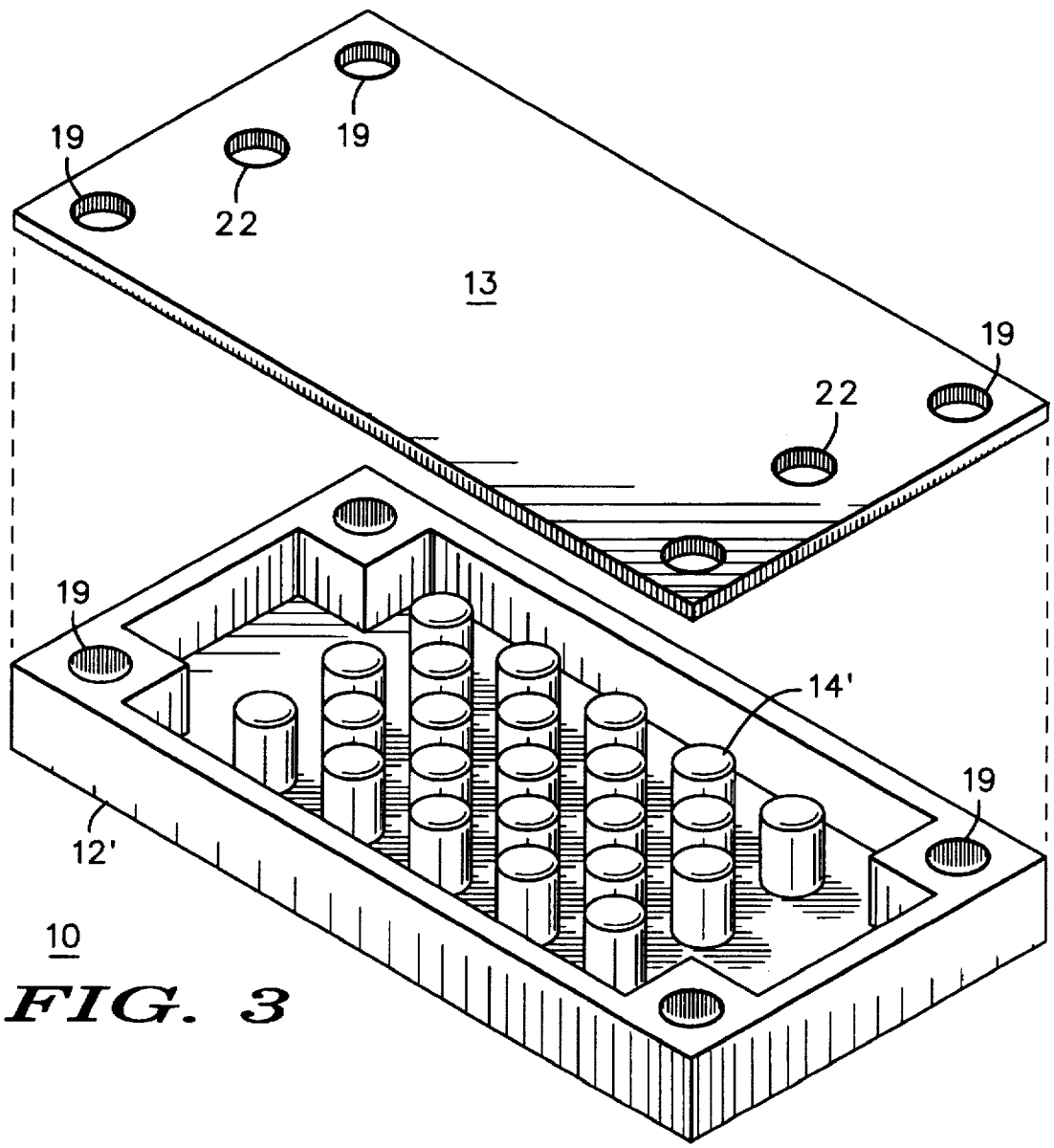
FIG. 3 is a simplified exploded perspective view of of an embodiment including pin fin 14'.

Base 12 further includes internal fins 14 for routing the liquid coolant which passes through the liquid cooled heatsink structure. Such a configuration is well known to those with average knowledge of the industry, and it will be understood that many other fin configurations may be used, including pin fins and ribbed fins parallel to the direction fluid travel. For example, FIG. 3 illustrates an embodiment wherein base 12' includes internal pin fins 14'.

In order to form a hermetically sealed MMC liquid cooled heatsink structure, base 12 and lid 13 are brought together and infiltrated, as is well known by those with average knowledge of the industry. Various techniques for infiltration may be used and are discussed in more detail below. An important feature of the discussed embodiment is that during infiltration, isolation layer 17 is brought into contact with the heatsink structure.

Isolation layer 17 comprises an aluminum oxide ceramic layer having metal patterned on the layer, represented by metal patterns 18. Isolation layer 17 may alternatively comprise epoxy or other suitable materials as are well known to those of average knowledge of the industry. It will be understood that metal patterns of isolation layer 17 provide the basis for an electronic circuit (discussed in more detail below) which will be situated on isolation layer 17. Isolation layer 17 provides electrical isolation between the electronic circuit and the liquid cooled heatsink. Electronic circuits 23', 23", and 23'" collectively referred to as electronic circuit 23 in FIG. 2) are mounted to metal patterns 18. In accordance with one embodiment, circuits 23', 23", and 23'" are insulated gate bipolar transistors in die form, wherein one side of each die serves as a collector contact and a second side of each die has source and gate contacts. The collector contacts of each circuit 23', 23", and 23'" are mounted to metal patterns 18a', 18a", and 18a'", respectively. The source contacts of each circuit 23', 23", and 23'" are coupled to the respective metal patterns 18b', 18b", and 18b'", by conductors 20a', 20a'", and 20a'", respectively. Likewise, the gate contacts of each circuit 23', 23", and 23'" are coupled to the respective metal patterns 18c', 18c", and 18c'", by conductors 20b', 20b", and 20b'", respectively. It should be understood by those skilled in the art that metal patterns 18a', 18a", 18a'", 18b', 18b", 18b'", 18c', 18c", and 18c'" are collectively referred to metal patterns 18. Although not shown, those skilled in the art shall understand that metal patterns 18a', 18a", 18a'", 18b', 18b", 18b'", 18c', 18c", and 18c'" are coupled to external circuitry. It shall be understood that the same reference numerals are used in the figures to denote the same elements.

As mentioned briefly above, in the discussed embodiment the power dissipation apparatus is formed by positioning isolation layer 17 in intimate contact with MMC lid 13, and placing lid 13 in intimate contact with base 12. All three pieces are then placed in a bath of molten aluminum at atmospheric pressure. The molten aluminum infiltrates the metal matrix composite of base 12 and lid 13, and additionally bonds isolation layer 17 to lid 13 such that isolation layer 17 becomes integral to the overall power dissipation apparatus. Although base 12 and lid 13 are individual preform components prior to infiltration, the molten aluminum flows continuously within both preforms through capillary flow and unites the two parts into a single sealed, reinforced baseplate with a hollow inside having fins.

At the same time, isolation layer 17 becomes mechanically and atomically bonded to the newly formed silicon carbide/aluminum MMC heatsink 11, providing several advantages. Since it is not soldered to heatsink 11, there is no need for any metallization on both of its sides. This eliminates a layer of metallization (typically copper for direct bond copper isolation substrates) and the corresponding solder layer used to attach the substrate to a conventional copper heatsink. This results in fewer layers and interfaces for the entire thermal stack, thereby reducing thermal resistance.

Another type of infiltration exists in which the silicon carbide preforms are placed in a mold cavity having the same shape as the preform, while molten aluminum is injected at high pressures. In this case, the inside cavity of heatsink 11 is temporarily filled with a material that is removed after infiltration. This prevents high pressured molten aluminum filling the liquid cooling cavity.

As discussed, once power dissipation apparatus 10 is infiltrated, base 12 and lid 13 become a single hermetically sealed component. This eliminates the need for carefully welding or brazing a lid to a base and the associated costs and corrosion issues.

Lid 13 and base 12 include mounting holes 19 for mounting apparatus 10 to a surface in the environment where it will operate. During infiltration, mounting holes 19 of lid 13 are aligned to mounting holes 19 of base 12 and in the case of pressurized infiltration, are masked or otherwise blocked so that they remain open after infiltration. This can be done with simple mold inserts. Additionally, lid 13 includes liquid access holes 22. Liquid access holes 22 are masked or blocked during infiltration so that they remain open. Liquid access holes 22 provide access to MMC liquid cooled heatsink structure 11 for the flow of coolant.

Figure 2:
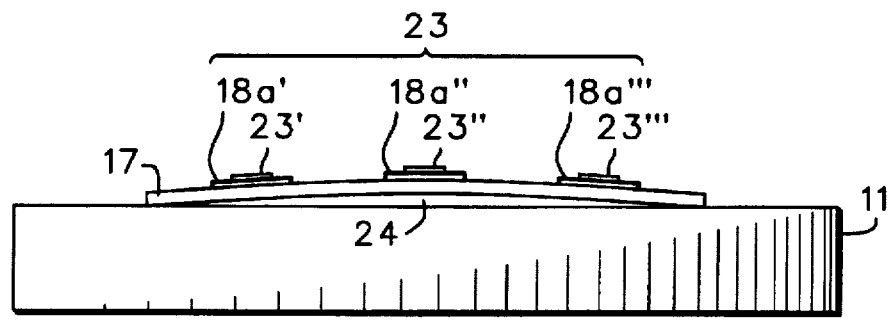
FIG. 2 is a side view of the power dissipation apparatus of FIG. 1, further including electronic components.

FIG. 2 is a side view of power dissipation apparatus 10. FIG. 2 shows isolation layer 17 integrally associated with MMC liquid cooled heatsink structure 11. Additionally, electronic components comprising electronic circuit 23 are illustrated mounted on isolation layer 17.

An exaggerated bow of isolation layer 17 is shown in FIG. 2. In reality, any bow present in isolation layer 17 would typically be undetectable to the naked eye. However, for illustration purposes, bow region 24 is shown.

It will be understood by those with average knowledge of the industry that bows or voids are sometimes present between interfaces of different materials. The voids, such as void 24, may be due to thermal mismatches between the different materials, inaccuracies in manufacturing the different layers, etc. According to the discussed embodiment of the present invention, any voids between layers such as heatsink structure 11 and isolation layer 17 are conveniently and effectively filled during the infiltration process. In the embodiment discussed, void 24 would be filled with aluminum during the aluminum infiltration when isolation layer 17 is integrated into the overall power dissipation apparatus.

This eliminates the need for ensuring flatness of the heatsink. Conventionally, ceramic isolation substrates are soldered on copper heat sinks. The copper heat sinks must be prebowed to ensure a flat assembly after soldering. This prebowing process adds cost and is difficult to control. The problem is eliminated, in the discussed embodiment of the present invention, by allowing the aluminum to fill up any small voids that may be present.

It will be understood by those with average knowledge of the industry that a variety of electronic circuits, represented by circuit 23, may take advantage of the power dissipation apparatus of the present invention. For example, electronic circuit 23 may be a multi-layer circuit, wherein multiple isolation layers and interlayer electrical connections may be provided. Furthermore, it will be understood that the power dissipation apparatus in accordance with the present invention works effectively for many types of circuits, including for example, power devices, i.e., power transistors, or microprocessors.

Those with average knowledge of the industry will understand that electronic circuit 23 may be laid out, interconnected, etc. in accordance with well known methods.

By now it should be appreciated that an improved power dissipation apparatus has been disclosed. Specifically, the embodiment discussed in accordance with the present invention provides the advantages of molded technology which allows for complex geometries and shapes. Additionally, a single piece part liquid cooled baseplate with integral electrical isolation, and improved thermal resistances through reduction in the number of layers and interfaces in the thermal stack, is provided. Furthermore, the MMC liquid cooled baseplate is more closely thermally matched than traditional copper heatsinks.

While we have shown and described specific illustrative embodiments of the present invention, different embodiments, modifications and improvements will occur to those skilled in the art. We desire it to be understood, therefore, that this invention is not limited to the particular forms shown. We intend in the appended claims to cover all modifications that do not depart from the spirit and scope of this invention.

We claim:

1. A power dissipation apparatus comprising:

a metal matrix composite liquid cooled heatsink structure comprising a base and a lid;

an electrical isolation material positioned on and directly bonded to the metal matrix composite liquid cooled heatsink structure, the electrical isolation material having a first major surface, a second major surface, and a layer of conductive material disposed on the first major surface, wherein the second major surface contacts the metal matrix composite liquid cooled heatsink structure, and wherein the electrical isolation material is integral with the metal matrix composite liquid cooled heatsink structure and non-solder boned to the metal matrix composite material via a metal of the metal matrix composite liquid cooled heatsink structure which metal infiltrates said heatsink structure; and an electronic circuit positioned on the layer of conductive material disposed on the electrical isolation material.

2. The apparatus of claim 1 wherein the base comprises fins.

3. The apparatus of claim 1, wherein the metal matrix composite liquid cooled heatsink structure comprises an infiltrated metal matrix composite.

4. The apparatus of claim 1, wherein the isolation layer comprises aluminum oxide.

5. The apparatus of claim 1, wherein the isolation layer comprises epoxy.

6. The apparatus of claim 1, wherein the electronic circuit comprises a power transistor.

7. The apparatus of claim 1, wherein the electronic circuit comprises a microprocessor.

8. The apparatus of claim 1, wherein the insulating layer comprises aluminum nitride.

9. A power dissipation apparatus comprising:

a metal matrix composite liquid cooled heatsink comprising a base having internal pin fins and a lid;

an insulating layer positioned on the metal matrix composite liquid cooled heatsink, the insulating layer and the metal matrix liquid cooled heatsink being a unitary structure and the insulating layer having a first major surface, a second major surface, and a layer of conductive material disposed on the first major surface, wherein the second major surface is non-solder bonded to the metal matrix composite liquid cooled heatsink by a metal of the metal matrix composite liquid cooled heatsink which metal infiltrates said heatsink; and an electronic circuit positioned on the layer of conductive material disposed of the insulating layer.

10. The apparatus of claim 9, wherein the electronic circuit comprises a power transistor.

11. The apparatus of claim 9, wherein the insulating layer comprises aluminum nitride.

* * * * *

UNITED STATES PATENT AND TRADEMARK OFFICE
CERTIFICATE OF CORRECTION

PATENT NO. : 5,666,269
DATED : September 9, 1997
INVENTOR(S) : Guillermo L. Romero et al.

It is certified that error appears in the above-indentified patent and that said Letters Patent is hereby corrected as shown below:

In Claim 1, column 5, line 29, delete "boned" and insert --bonded--.

Signed and Sealed this

Twenty-fifth Day of November, 1997

Attest:

BRUCE LEHMAN

Attesting Officer

Commissioner of Patents and Trademarks